(12) United States Patent
Anderson et al.

(10) Patent No.: US 7,335,932 B2
(45) Date of Patent: Feb. 26, 2008

(54) PLANAR DUAL-GATE FIELD EFFECT TRANSISTORS (FETS)

(75) Inventors: Brent A. Anderson, Jericho, VT (US); Andres Bryant, Burlington, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 338 days.

(21) Appl. No.: 10/907,745

(22) Filed: Apr. 14, 2005

(65) Prior Publication Data

US 2006/0231873 A1    Oct. 19, 2006

(51) Int. Cl.
*H01L 29/76* (2006.01)

(52) U.S. Cl. .................................... 257/288

(58) Field of Classification Search ............... 257/376, 257/347, 288
See application file for complete search history.

(56) References Cited

U.S. PATENT DOCUMENTS

| | | | |
|---|---|---|---|
| 5,008,723 A | 4/1991 | van der Have | |
| 5,463,241 A * | 10/1995 | Kubo | 257/376 |
| 5,949,108 A * | 9/1999 | Doyle | 257/347 |
| 6,479,868 B1 | 11/2002 | An et al. | |
| 6,774,436 B1 | 8/2004 | Yu et al. | |
| 6,774,437 B2 | 8/2004 | Bryant et al. | |

* cited by examiner

*Primary Examiner*—Carl Whitehead, Jr.
*Assistant Examiner*—Monica D Harrison
(74) *Attorney, Agent, or Firm*—Schmeiser, Olsen & Watts; William D. Sabo

(57) ABSTRACT

A semiconductor structure and the associated method for fabricating the same. The semiconductor structure includes (a) a semiconductor substrate, (b) a back gate region on the semiconductor substrate, (c) a back gate dielectric region on the back gate region, (d) a semiconductor region on the back gate dielectric region comprising a channel region disposed between first and second source/drain (S/D) regions, (e) a main gate dielectric region on the semiconductor region, (f) a main gate region on the main gate dielectric region, (g) a first contact pad adjacent to the first S/D region and electrically insulated from the back gate region, and (h) a first buried dielectric region that physically and electrically isolates the first contact pad and the back gate region, and wherein the first buried dielectric region has a first thickness in the first direction at least 1.5 times a second thickness of the back gate region.

6 Claims, 5 Drawing Sheets

PLANAR DUAL-GATE FIELD EFFECT TRANSISTORS (FETS)

BACKGROUND OF THE INVENTION

1. Technical Field

The present invention relates to field effect transistors (FETs), and more specifically, to planar dual-gate FETs (i.e., planar FETs that have main gates and back gates).

2. Related Art

The switching speed of a typical planar dual-gate FET depends on, among other things, the capacitances between the S/D regions and the back gate region of the typical planar dual-gate FET. The higher such capacitances, the longer it takes for switching (because it takes time for charging and discharging the capacitors), which is undesirable.

Therefore, there is a need for a planar dual-gate FET (and a method for fabricating the same) in which capacitances between the S/D regions and the back gate region are relatively lower than that of the prior art.

SUMMARY OF THE INVENTION

The present invention provides a semiconductor structure, comprising (a) a semiconductor substrate; (b) a back gate region on the semiconductor substrate; (c) a back gate dielectric region on the back gate region in a first direction, wherein the first direction is perpendicular to an interfacing surface between the back gate region and the semiconductor substrate; (d) a semiconductor region on the back gate dielectric region in the first direction, wherein the semiconductor region comprises a channel region and first and second source/drain (S/D) regions, wherein the channel region is disposed between the first and second S/D regions, and wherein the semiconductor region is electrically insulated from the back gate region by the back gate dielectric region; (e) a main gate dielectric region on the semiconductor region in the first direction; (f) a main gate region on the main gate dielectric region in the first direction, wherein the semiconductor region is electrically insulated from the main gate region by the main gate dielectric region; and (g) a first contact pad adjacent to the first S/D region in a second direction and in direct physical contact with the first S/D region, wherein the second direction is perpendicular to the first direction and pointing from the second S/D region to the first S/D region; and (h) a first buried dielectric region directly beneath the first contact pad in the first direction and in direct physical contact with the first contact pad and the back gate region, wherein the first buried dielectric region physically and electrically isolates the first contact pad and the back gate region, and wherein the first buried dielectric region has a first thickness in the first direction at least 1.5 times a second thickness of the back gate region.

The present invention also provides a semiconductor structure fabrication method, comprising providing a semiconductor substrate, a back gate layer on the semiconductor substrate, a back gate dielectric layer on the back gate layer in a first direction, wherein the first direction is perpendicular to an interfacing surface between the back gate layer and the semiconductor substrate, a semiconductor layer on the back gate dielectric layer in the first direction, wherein the semiconductor layer is electrically insulated from the back gate layer by the back gate dielectric layer, and a main gate dielectric layer on the semiconductor layer in the first direction; removing portions of the main gate dielectric layer, the semiconductor layer, the back gate dielectric layer, and the back gate layer so as to form first and second trenches such that a back gate dielectric region disposed between the first and second trenches results from the back gate dielectric layer, a semiconductor region disposed between the first and second trenches results from the semiconductor layer, and a main gate dielectric region disposed between the first and second trenches results from the main gate dielectric layer; forming first and second buried dielectric regions in the first and second trenches, respectively, and in direct physical contact with the back gate dielectric layer, wherein the first buried dielectric region has a first thickness in the first direction at least 1.5 times a second thickness of the back gate region; and forming first and second contact pads on the first and second buried dielectric regions and in the first and second trenches, respectively, wherein the first and second contact pads are in direct physical contact with the semiconductor region, wherein the first and second contact pads are electrically insulated from the back gate region The present invention also provides a planar dual-gate FET (and a method for fabricating the same) in which capacitances between the S/D regions and the back gate region are relatively lower than that of the prior art.

DETAILED DESCRIPTION OF THE INVENTION

Figure 1:
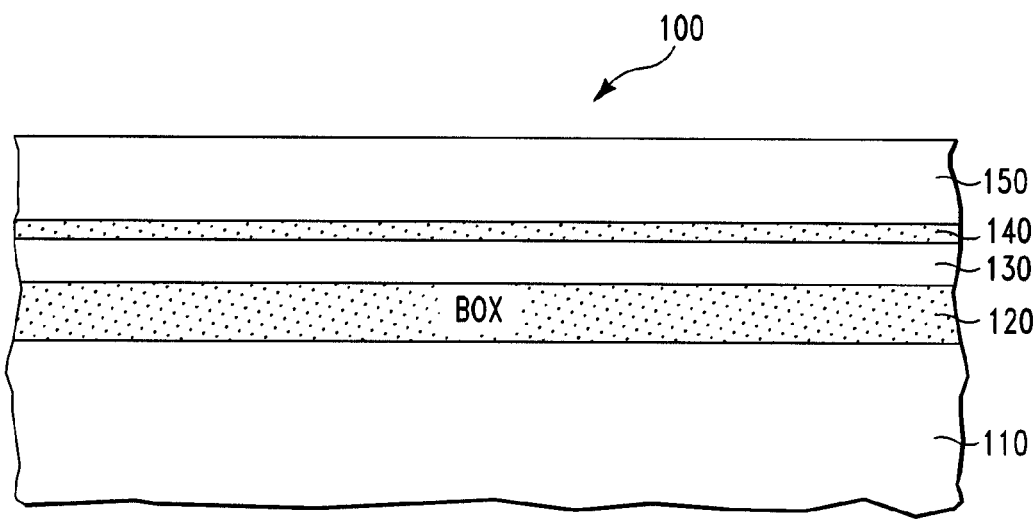
FIGS. 1-5 illustrate cross-section views of a semiconductor structure going through different fabrication steps, in accordance with embodiments of the present invention.

FIGS. 1-5 illustrate cross-section views of a semiconductor structure 100 going through different fabrication steps, in accordance with embodiments of the present invention. More specifically, with reference to FIG. 1, the fabrication steps can start out with a structure 100 comprising (a) a semiconductor (e.g., silicon, germanium, etc.) substrate 110, (b) a buried oxide (BOX) layer 120 on top of the semiconductor substrate 110, (c) a back gate layer 130 on top of the BOX layer 120, (d) a back gate dielectric layer 140 on top of the back gate layer 130, and (e) a semiconductor (i.e., silicon, germanium, etc.) layer 150 on top of the back gate dielectric layer 140. In one embodiment, the BOX layer 120 can comprise silicon dioxide, the back gate layer 130 can comprise silicon, and the back gate dielectric layer 140 can comprise silicon dioxide.

Figure 6A:
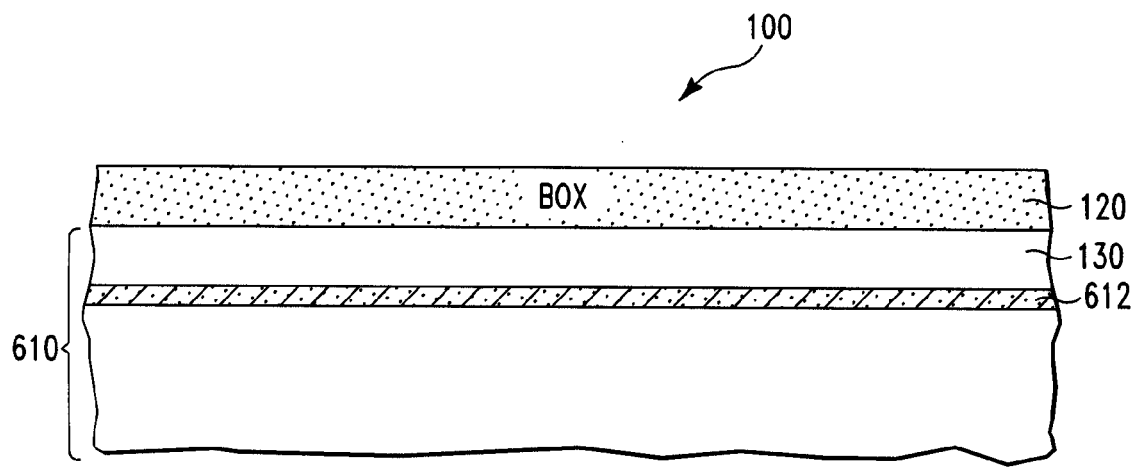
FIGS. 6A-6D illustrate a process for forming the semiconductor structure of FIG. 1, in accordance with embodiments of the present invention.

In one embodiment, the structure 100 of FIG. 1 can be formed using a double SOI (silicon on insulator) process. FIGS. 6A-6D illustrate the formation of the structure 100 of FIG. 1 using the double SOI process. With reference to FIG. 6A, the double SOI process can start with a silicon substrate 610.

Next, the BOX layer 120 can be formed on top of the silicon substrate 610 by, illustratively, chemical vapor deposition (CVD).

Next, hydrogen II ions can be implanted in the silicon substrate 610 so as to form a hydrogen ion layer 612 embedded in the silicon substrate 610, resulting in the structure 100 of FIG. 6A. The portion of the silicon substrate 610 above the hydrogen II ion layer 612 will become the back gate layer 130.

Figure 6B:
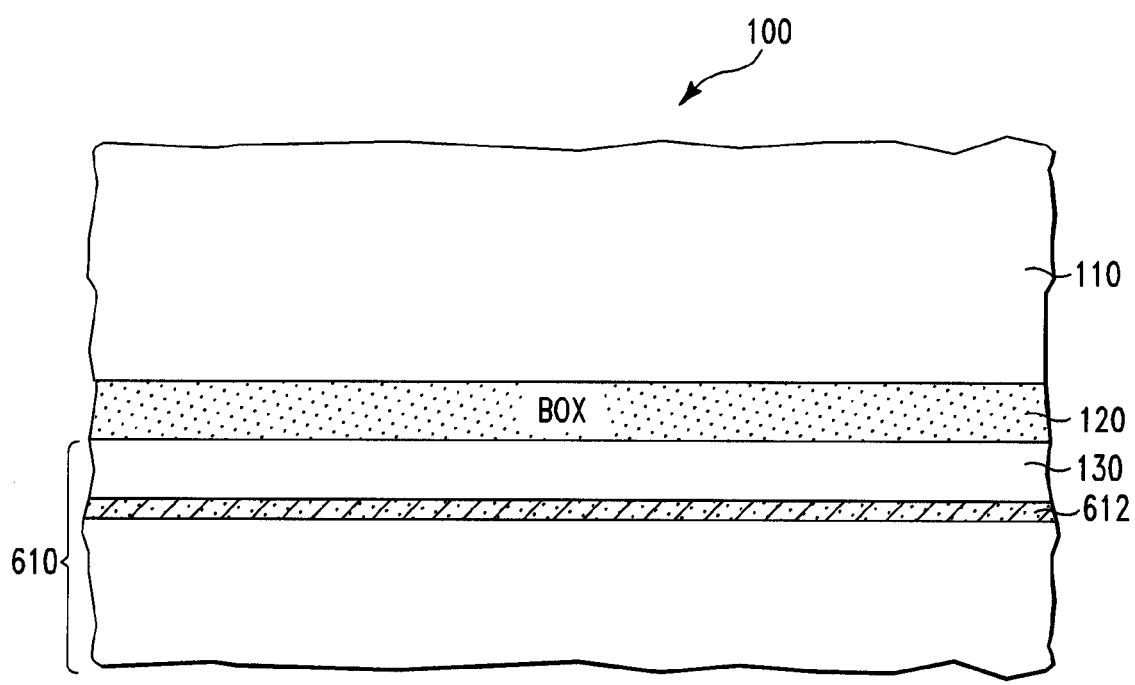

Next, with reference to FIG. 6B, the semiconductor substrate 110 can be bonded to BOX layer 120 resulting in the structure 100 of FIG. 6B.

Next, the structure 100 of FIG. 6B can be annealed so that the structure 100 of FIG. 6B splits along the hydrogen ion layer 612. The upper portion of the structure 100 of FIG. 6B after the split is turned upside down resulting in the structure 100 of FIG. 6C.

Figure 6C:
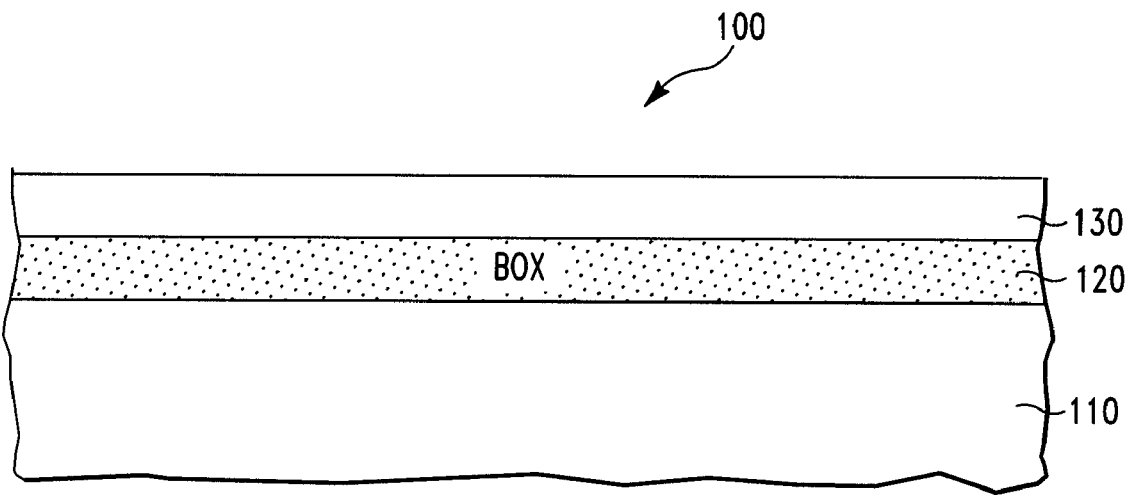
Figure 6D:
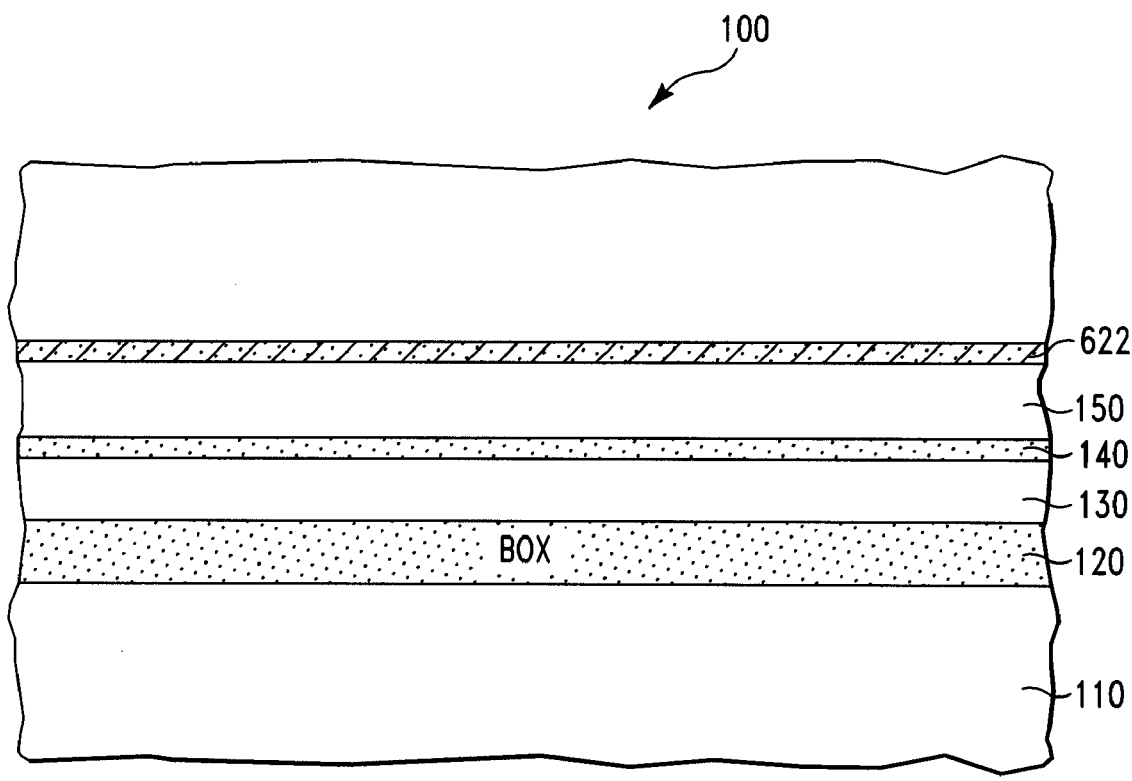

Next, a structure similar to the structure 100 of FIG. 6A can be turned upside down and bonded to the semiconductor layer 130 of FIG. 6C resulting in the structure 100 of FIG. 6D.

Next, the structure 100 of FIG. 6D can be annealed so that the structure 100 of FIG. 6D splits along the hydrogen ion layer 622. The lower portion of the structure 100 of FIG. 6D after the split can be used as the structure 100 of FIG. 1.

Figure 2:
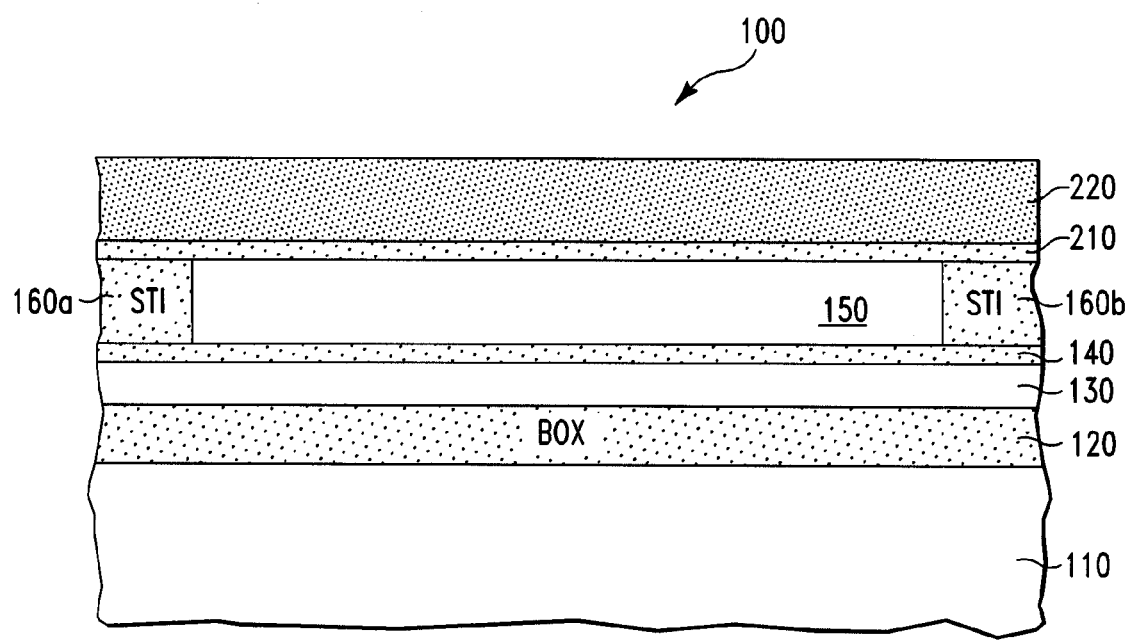

Next, with reference to FIG. 2, shallow trench isolation (STI) regions 160a and 160b can be formed in the semiconductor layer 150 using any conventional method.

Next, an oxide layer 210 can be formed on top of the entire structure 100 of FIG. 1 by, illustratively, thermal oxidation or chemical vapor deposition (CVD). Next, a nitride layer 220 can be formed on top of the oxide layer 210 by, illustratively, CVD.

Figure 3:
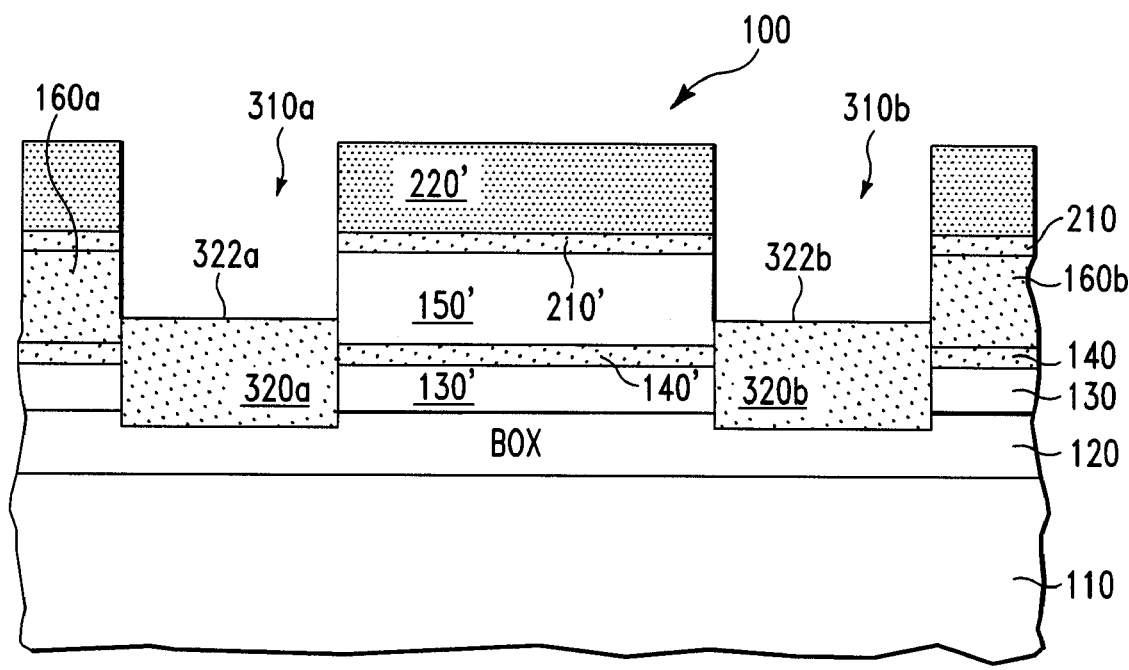

Next, with reference to FIG. 3, two trenches 310a and 310b can be formed in the structure 100 of FIG. 2. More specifically, in one embodiment, the trenches 310a and 310b can be formed by directionally etching (e.g., using reactive ion etching or RIE etch) in turn the nitride layer 220, the oxide layer 210, the semiconductor layer 150, the back gate dielectric layer 140, the back gate layer 130, and the buried oxide layer 120 in that order. In one embodiment, the directional etch that forms the trenches 310a and 310b etches completely through the back gate layer 130 but does not etch completely through the buried oxide layer 120. It should be noted that portions of the nitride layer 220, the oxide layer 210, the semiconductor layer 150, the back gate dielectric layer 140, the back gate layer 130 that are disposed between the trenches 310a and 310b can be referred to as the nitride region 220', the oxide region 210' the semiconductor region 150', the back gate dielectric region 140', and the back gate region 130', respectively.

Next, buried dielectric regions 320a and 320b can be formed in the trenches 310a and 310b, respectively. In one embodiment, the buried dielectric regions 320a and 320b can comprise silicon dioxide ($SiO_2$), and can be formed by, illustratively, (a) depositing a $SiO_2$ layer (not shown) on top of the entire structure 100 of FIG. 3 such that the trenches 310a and 310b are completely filled with $SiO_2$ material, then (b) etching back the deposited $SiO_2$ layer until top surfaces 322a and 322b of the buried dielectric regions 320a and 320b, respectively, are at the level of the semiconductor region 150'. The process of forming the buried dielectric regions 320a and 320b by filling the trenches 310a and 310b and etching back can be referred to as a fill and recess process.

Figure 4:
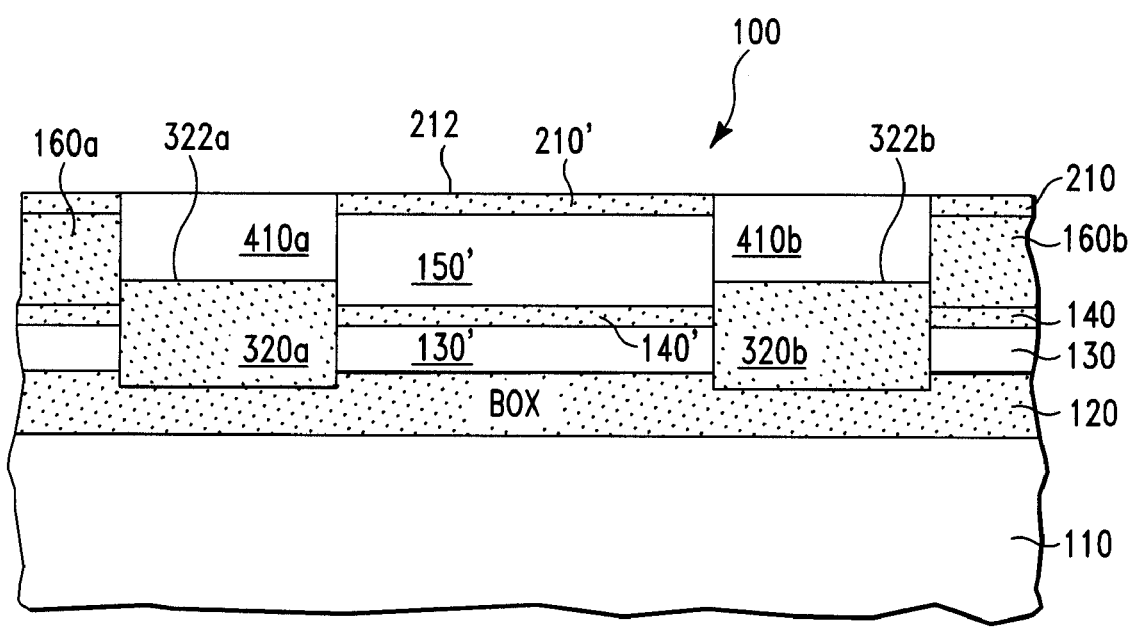

Next, with reference to FIG. 4, contact pads 410a and 410b can be formed on top of the buried dielectric regions 320a and 320b in the trenches 310a and 310b (FIG. 3), respectively. In one embodiment, the contact pads 410a and 410b can comprise polysilicon. The polysilicon contact pads 410a and 410b can be formed by (a) depositing polysilicon on the entire structure 100 of FIG. 3 and then (b) planarizing using a conventional chemical mechanical polishing (CMP) process until a top surface 212 of the oxide region 210' is exposed to the atmosphere. The process of forming the contact pads 410a and 410b by depositing polysilicon and then planarizing can be referred to as a deposit and planarize process. Because the top surfaces 322a and 322b of the buried dielectric regions 320a and 320b, respectively, are at the level of the semiconductor region 150', the contact pads 410a and 410b are in direct physical contact with the semiconductor region 150'. Next, the oxide layer 210 (including the oxide region 210') is removed.

Figure 5:
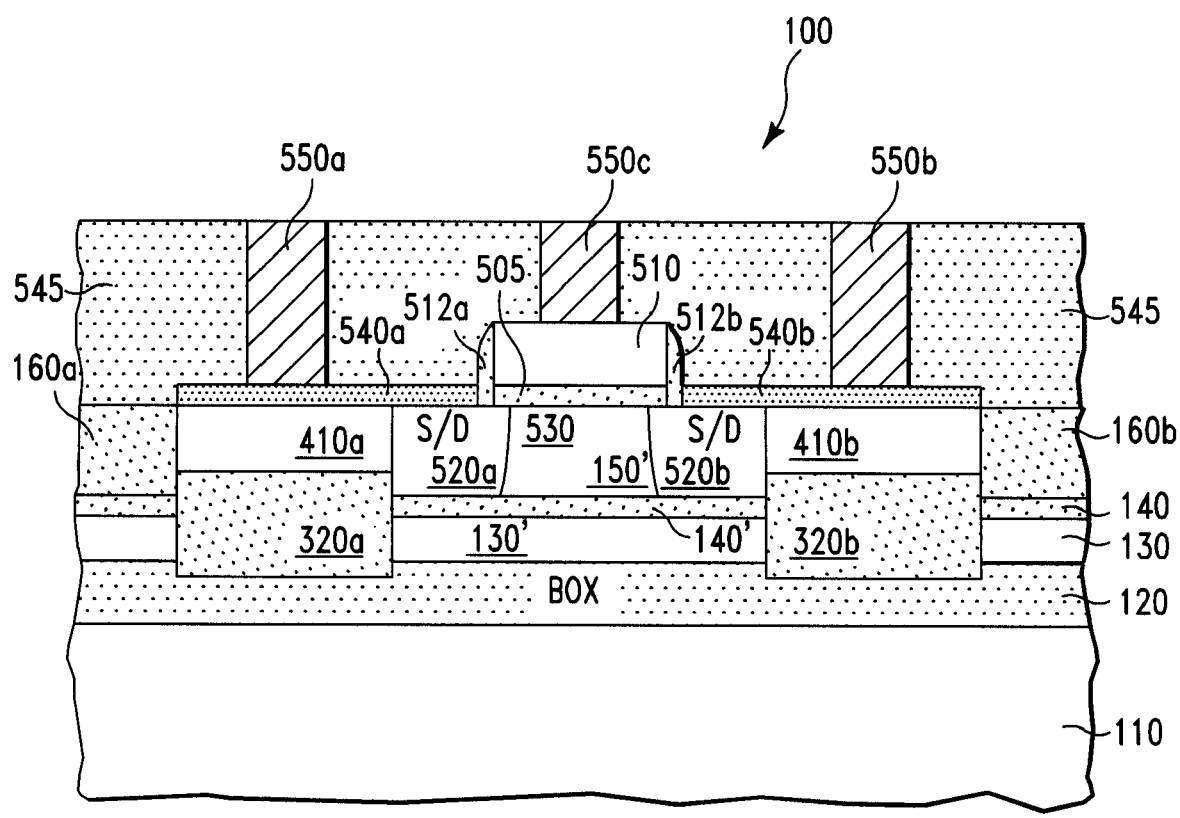

Next, with reference to FIG. 5, a main gate stack 510,505 comprising a main gate dielectric region 505 and a main gate region 510 can be formed on top of the semiconductor region 150'. In one embodiment, the main gate region 510 can comprise polysilicon. The main gate stack 510, 505 can be formed by (a) depositing a main gate dielectric layer (not shown) on top of the entire structure 100 of FIG. 4 (after the oxide layer 210 is removed), then (b) depositing a main gate layer (not shown) on top of the main gate dielectric layer, and then (c) etching back the deposited main gate layer and the main gate dielectric layer to form the main gate stack 510, 505 using any conventional photolithography process.

Next, main gate spacers 512a and 512b can be formed on side walls of the main gate stack 510,505. The main gate spacers 512a and 512b can comprise silicon dioxide and can be formed using any conventional method.

Next, the main gate stack 510, 505 and the main gate spacers 512a and 512b can be used as a mask to dope the semiconductor region 150' so as to form source/drain (S/D) regions 520a and 520b in the semiconductor region 150'. In one embodiment, ion implantation can be used for this doping process. The portion 530 of the semiconductor region 150' directly beneath the gate stack 510, 505 and disposed between the S/D regions 520a and 520b can be referred to as the channel region 530.

Next, a silicide region 540a can be formed on top and in direct physical contact with both the contact pad 410a and the S/D region 520a, while a silicide region 540b can be formed on top and in direct physical contact with both the contact pad 410b and the S/D region 520b.

The silicide regions 540a and 540b can be formed by (a) depositing a metal material (e.g., cobalt, titanium, etc.) on top of the entire structure 100 of FIG. 5 (without the metal vias 550a, 550b, and 550c, and the silicide regions 540a and 540b at this time), then (b) heating up the metal material such that the metal material chemically reacts with silicon of the contact pads 410a and 410b and the S/D regions 520a and 520b to form the silicide regions 540a and 540b, and then (c) removing the remaining metal material by a wet etch step.

Next, a dielectric layer 545 can be formed on top of the entire structure 100 by, illustratively, CVD. Next, metal vias 550a and 550b can be formed in the dielectric layer 545 and on top of the silicide regions 540a and 540b, respectively, while a metal via 550c can be formed in the dielectric layer 545 and on top of the main gate region 510. The vias 550a, 550b, 550c can be used to electrically couple the structure 100 to an upper interconnect layer (not shown).

It should be understood that, although not shown, a contact to the back gate region 130' may be formed, using any conventional method, to provide an electric connection between an upper interconnect layer (not shown) and the back gate region 130'.

In summary, because of the buried dielectric region 320a, the first S/D block (including the S/D region 520a, the contact pad 410a, and silicide region 540a, and the metal via 550a) forms with the back gate region 130' a first capacitance relatively lower than that of the prior art. Similarly, because of the buried dielectric region 320b, the second S/D block (including the S/D region 520b, the contact pad 410b, the silicide region 540b, and the metal via 550b) forms with the back gate region 130' a second capacitance relatively lower than that of the prior art. As a result, the structure 100 can switch faster than devices of the prior art.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor structure, comprising:
   a semiconductor substrate;
   a back gate region on the semiconductor substrate;
   a back gate dielectric region on the back gate region in a first direction, wherein the first direction is perpendicular to an interfacing surface between the back gate region and the semiconductor substrate;
   a semiconductor region on the back gate dielectric region in the first direction, wherein the semiconductor region comprises a channel region and first and second source/drain (S/D) regions, wherein the channel region is disposed between the first and second S/D regions, and wherein the semiconductor region is electrically insulated from the back gate region by the back gate dielectric region;
   a main gate dielectric region on the semiconductor region in the first direction;
   a main gate region on the main gate dielectric region in the first direction, wherein the semiconductor region is electrically insulated from the main gate region by the main gate dielectric region;
   a first contact pad adjacent to the first S/D region in a second direction and in direct physical contact with the first S/D region, wherein the second direction is perpendicular to the first direction and pointing from the second S/D region to the first S/D region;
   a first buried dielectric region directly beneath the first contact pad in the first direction and in direct physical contact with the first contact pad and the back gate region,
      wherein the first buried dielectric region physically and electrically isolates the first contact pad and the back gate region,
      wherein the first buried dielectric region has a first thickness in the first direction at least 1.5 times a second thickness of the back gate region, and
      wherein the first buried dielectric region is in direct physical contact with the first S/D region, the back gate dielectric region, and the back gate region;
   a second contact pad adjacent to the second S/D region in a third direction and in direct physical contact with the second S/D region, wherein the third direction is perpendicular to the first direction and pointing from the first S/D region to the second S/D region; and
   a second buried dielectric region directly beneath the second contact pad in the first direction and in direct physical contact with the second contact pad and the back gate region,
      wherein the second buried dielectric region physically and electrically isolates the second contact pad and the back gate region, and
      wherein the second buried dielectric region has a third thickness in the first direction at least 1.5 times a fourth thickness of the back gate region.

2. The structure of claim 1, wherein the second buried dielectric region is in direct physical contact with the second S/D region, the back gate dielectric region, and the back gate region.

3. The structure of claim 2, further comprising a first silicide region on the first contact pad and the first S/D region in the first direction and in direct physical contact with the first contact pad and the first S/D region.

4. The structure of claim 3, further comprising a first metal via on the first silicide region in the first direction and in direct physical contact with the first silicide region.

5. The structure of claim 4, further comprising a second silicide region on the second contact pad and the second S/D region in the first direction and in direct physical contact with the second contact pad and the second S/D region.

6. The structure of claim 5, further comprising a second metal via on the second silicide region in the first direction and in direct physical contact with the second silicide region.

* * * * *